(12) United States Patent
Wu et al.

(10) Patent No.: US 6,169,438 B1
(45) Date of Patent: Jan. 2, 2001

(54) CIRCUIT AND METHOD FOR SELECTIVELY DELAYING ELECTRICAL SIGNALS

(75) Inventors: Shengquan Wu, Sunnyvale; Phares J. Grey, Milpitas, both of CA (US)

(73) Assignee: Oak Technology, Inc., Sunnyvale, CA (US)

(*) Notice: Under 35 U.S.C. 154(b), the term of this patent shall be extended for 0 days.

(21) Appl. No.: 09/399,312

(22) Filed: Sep. 20, 1999

(51) Int. Cl.[7] .................................................. H03H 11/26
(52) U.S. Cl. .......................... 327/276; 327/277; 327/237; 327/407; 327/408
(58) Field of Search ................................. 327/276, 277, 327/278, 407, 408, 237

(56) References Cited

U.S. PATENT DOCUMENTS 4,926,423 * 5/1990 Zukowski ............................ 327/407
5,670,904 * 9/1997 Moloney et al. ..................... 327/277

* cited by examiner

*Primary Examiner*—Kenneth B. Wells
*Assistant Examiner*—Cassandra Cox (57) ABSTRACT

A circuit and method for selectively and dynamically delaying a signal is presented. A series of delay modules are used to provide progressively finer delays. A multiplexer is used after each delay module to select one of a plurality of signals to pass on to a subsequent delay module. Each multiplexer is controlled by a control signal which can vary in time so that different delays can be selected for different portions of the signal to be delayed. By providing the proper control signals to the multiplexers any delay corresponding to a sum of the available individual delays generated by the individual delay modules is possible. The circuit and method are particularly useful for imposing individual delay times on the pulses in a logic level signal.

15 Claims, 7 Drawing Sheets

| OUTPUT SIGNAL | CS[3] | CS[2] | CS[1] | E1 | E2 | E3 | E4 |
|---|---|---|---|---|---|---|---|
| D | 1 | X | X | 0 | 0 | 0 | 1 |
| C | 0 | 1 | X | 0 | 0 | 1 | 0 |
| B | 0 | 0 | 1 | 0 | 1 | 0 | 0 |
| A | 0 | 0 | 0 | 1 | 0 | 0 | 0 |

CIRCUIT AND METHOD FOR SELECTIVELY DELAYING ELECTRICAL SIGNALS

FIELD OF THE INVENTION

The invention relates generally to a circuit and method for delaying signals, and in particular, to a circuit and method for selectively delaying electrical signals using a control signal.

BACKGROUND OF THE INVENTION

Electrical circuits which process logic level signals often require a variable, dynamically controllable delay for each pulse. One example where the capability to selectively delay pulses is desirable is the CD-R/RW writing process. For CD recordable (CD-R) media, the writing process includes generation of burn holes in a thin film. For CD rewritable media (CD-RW), the writing process includes generating marks and spaces by phase-changing spots in the media.

This results in better control of the physical dimensions of each mark. Due to thermal heating effects, the length of a mark on the CD is determined not only by the on-time and the optical power of the write laser but also by the characteristics of its neighboring marks and spaces. Thus, it is desirable to individually modify the output power of each laser write pulses according to the content of neighboring marks and spaces.

SUMMARY OF THE INVENTION

The invention relates to a circuit and method for selectively delaying an electrical signal. A series of delay modules are used to provide progressively finer delays. The path through the delay modules is determined by a series of selectors which select one of a plurality of delayed signals to pass on to a subsequent delay module. Each selector is controlled by a control signal. The control signals are generated according to the desired delay to be imposed on the signal and can provide real-time delay adjustments to the logic signal.

In one aspect, the circuit of the invention includes a first delay module, a second delay module, a first selector and a second selector. The first delay module has an input to receive the signal to be delayed, a clock input and a signal output. The first selector has a first and a second input in communication with the first delay module input and first delay module signal output, respectively, a control input and an output. The second delay module has an input in communication with the first selector output, a clock input and an output. The second selector has a first, second and third input in communication with the first delay module input, the first delay module signal output and the second delay module signal output, respectively. The second selector also has an output and a control input. A selected pulse delay is generated in response to a first and a second control signal received at the first and second selector control inputs, respectively.

In one embodiment, the second selector control input includes a plurality of control lines and the second control signal includes a plurality of control bits. Each of the plurality of control lines is adapted to receive a respective control bit. In a further embodiment, each control bit is prioritized relative to the other control bits.

In one embodiment, the first selector includes a first tri-state buffer and a second tri-state buffer. The first tri-state buffer is in communication with the first delay module signal input and has a buffer enable input and an output. The second tri-state buffer is in communication with the first delay module signal output and has a buffer enable input. The second tri-state buffer also has an output which is in communication with the first buffer output.

In another aspect, the method of generating a selectively delayed signal includes the steps of receiving a signal to be delayed, generating a first delayed signal in response to a first clock delay signal having a first frequency, and selecting either the signal to be delayed or the first delayed signal as a first output signal. The method also includes the steps of generating a second delayed signal in response to a second clock delay signal having a second frequency and the first output signal, and selecting one of the signal to be delayed, the first delayed signal and the second delayed signal as the selectively delayed signal.

In one embodiment, the method includes the additional step of generating a third delayed signal in response to a third clock delay signal having a third frequency and the selected one of the signal to be delayed, the first delayed signal and the second delayed signal. In this embodiment, the step of selecting the signal to be the selectively delayed signal includes selecting one of the signals to be delayed, the first delayed signal, the second delayed signal and the third delayed signal as the selectively delayed signal.

BRIEF DESCRIPTION OF THE DRAWINGS

The foregoing and other objects, features and advantages of the invention will become apparent from the following more particular description of various embodiments of the invention, as illustrated in the accompanying drawings. The drawings are not necessarily to scale, emphasis instead being placed on illustrating the principles of the present invention.

DESCRIPTION OF THE INVENTION

Figure 1:
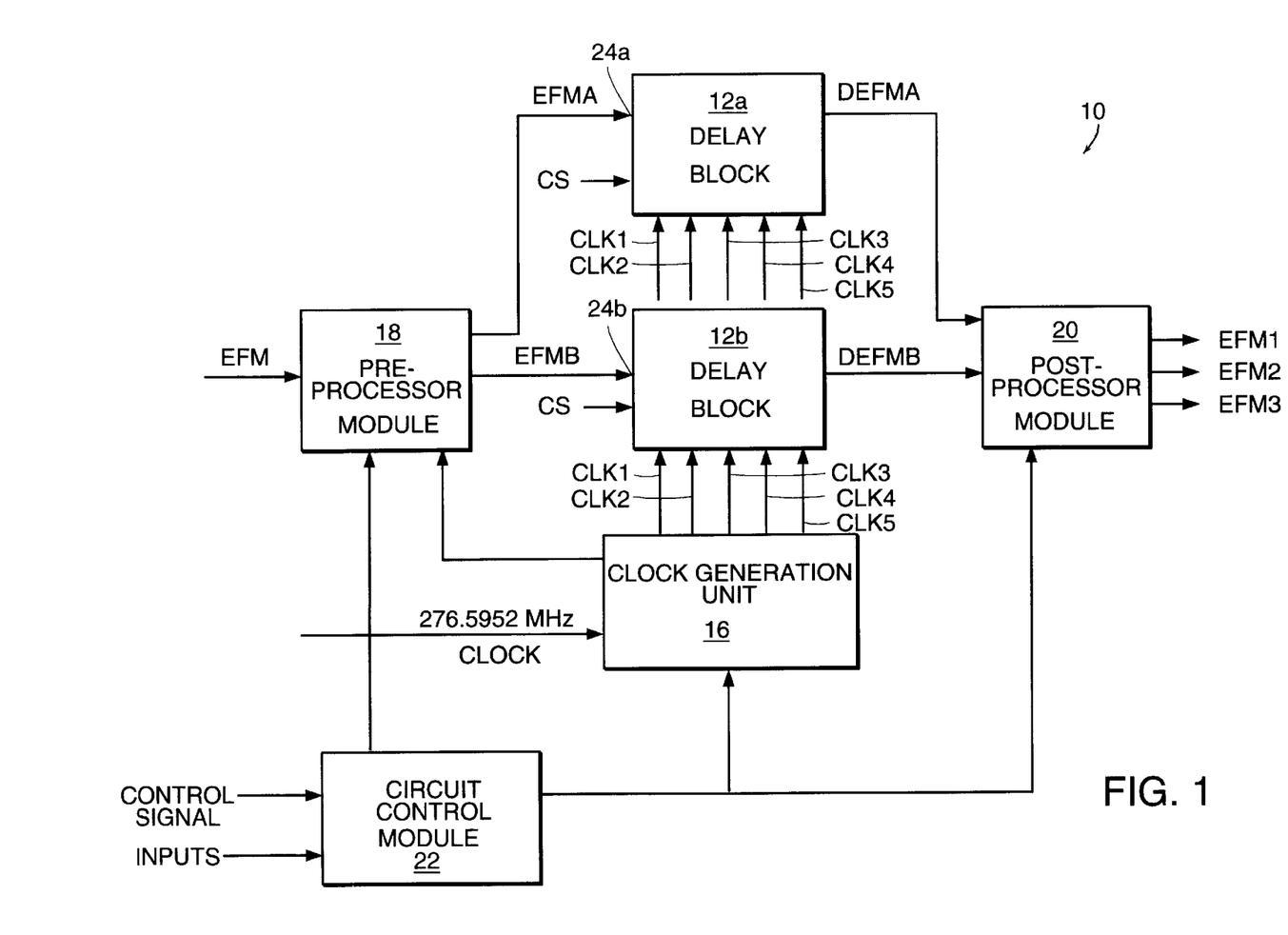
FIG. 1 is a block diagram of a system for receiving encoded EFM signals and generating post-processed EFM signals for CD laser control according to the present invention.

Referring to FIG. 1, a CD-Recordable/CD-Rewritable delay generation circuit 10 includes five delay blocks 12(a–e) although only 12a and 12b are shown for clarity. Each delay block 12(a–e) receives a respective clock signal CLK1 to CLK5 generated by a clock generation unit 16. Pre-processor module 18 receives an Eight to Fourteen Modulation code (EFM) signal and generates intermediate signals EFMA to EFME. Each delay block 12(*a–e*) receives a respective one of the intermediate signals EFMA to EFME and generates a delayed intermediate signal DEFMA to DEFME, respectively. A post-processor module 20 receives the delayed intermediate signals DEFMA to DEFME and generates multiple post-processed EFM signals EFM1 to EFM3 to control the CD laser.

Figure 2A:
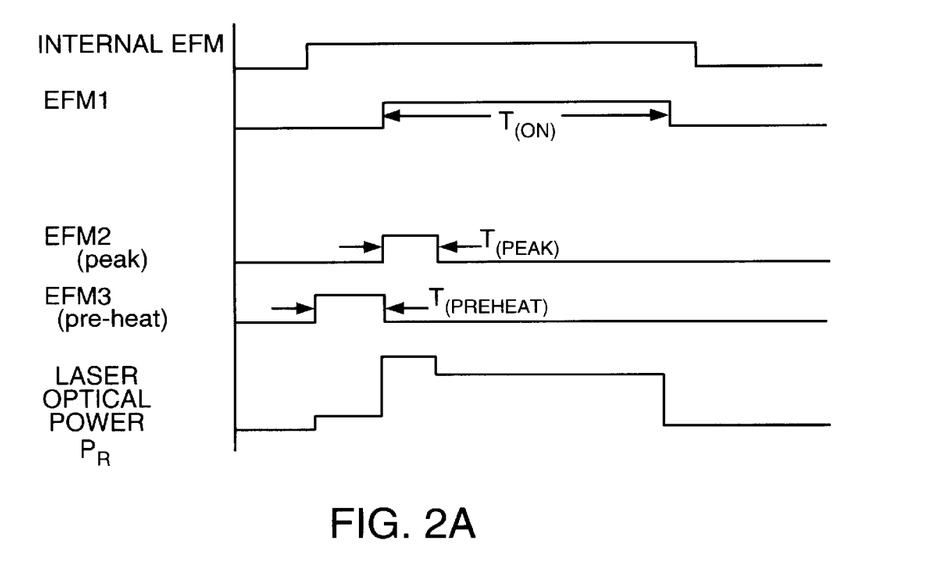
FIGS. 2A and 2B are illustrations of examples of post-processor module output waveforms for CD-R and CD-RW embodiments, respectively, of FIG. 1.
Figure 2B:
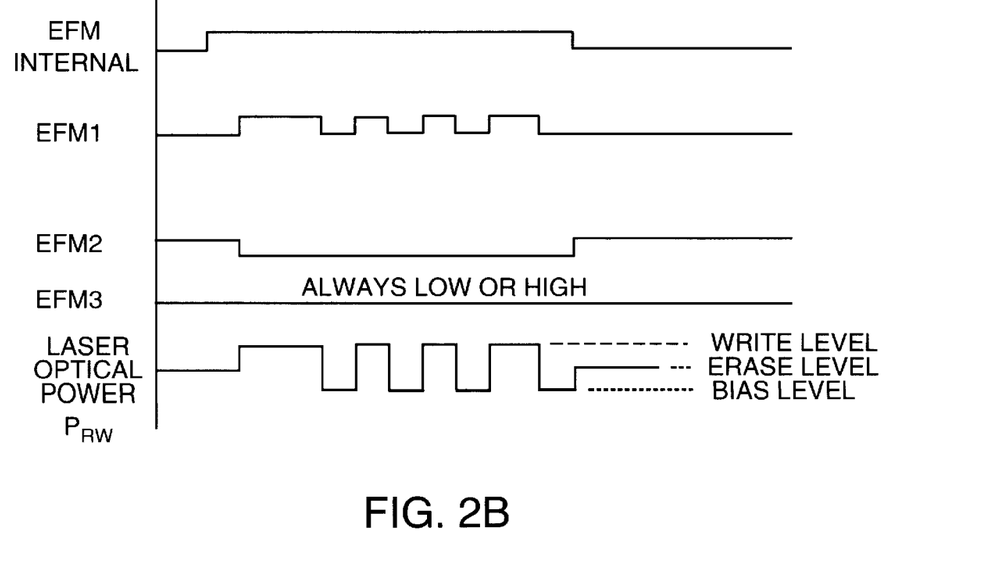

Referring to FIG. 2A, post-processed EFM signals EFM1 to EFM3 are combined (i.e., summed) to generate a laser power signal $P_R$ which controls the output power of the laser for a CD-R system. EFM1 controls the basic optical power during the on-time T(on) of the laser. EFM2 controls the additional optical power used during the peak period T(peak) of the optical pulse. EFM3 controls application of optical power during a pre-heat period T(preheat). The post-processed EFM signals EFM1 to EFM3 are the logic signals determined according to the data content on the nearby region of the CD and which dynamically control corresponding current sources. The sum of the currents is used to drive the laser, resulting in the laser output power $P_R$. This results in better control of the physical dimensions of each mark on the CD. Referring to FIG. 2B, post-processed EFM signals EFM1 to EFM3 are logic signal similarly used to control individual current. The sum of the current is used to drive the laser, resulting in the laser output power $P_{RW}$ for a CD-RW system.

Figure 3:
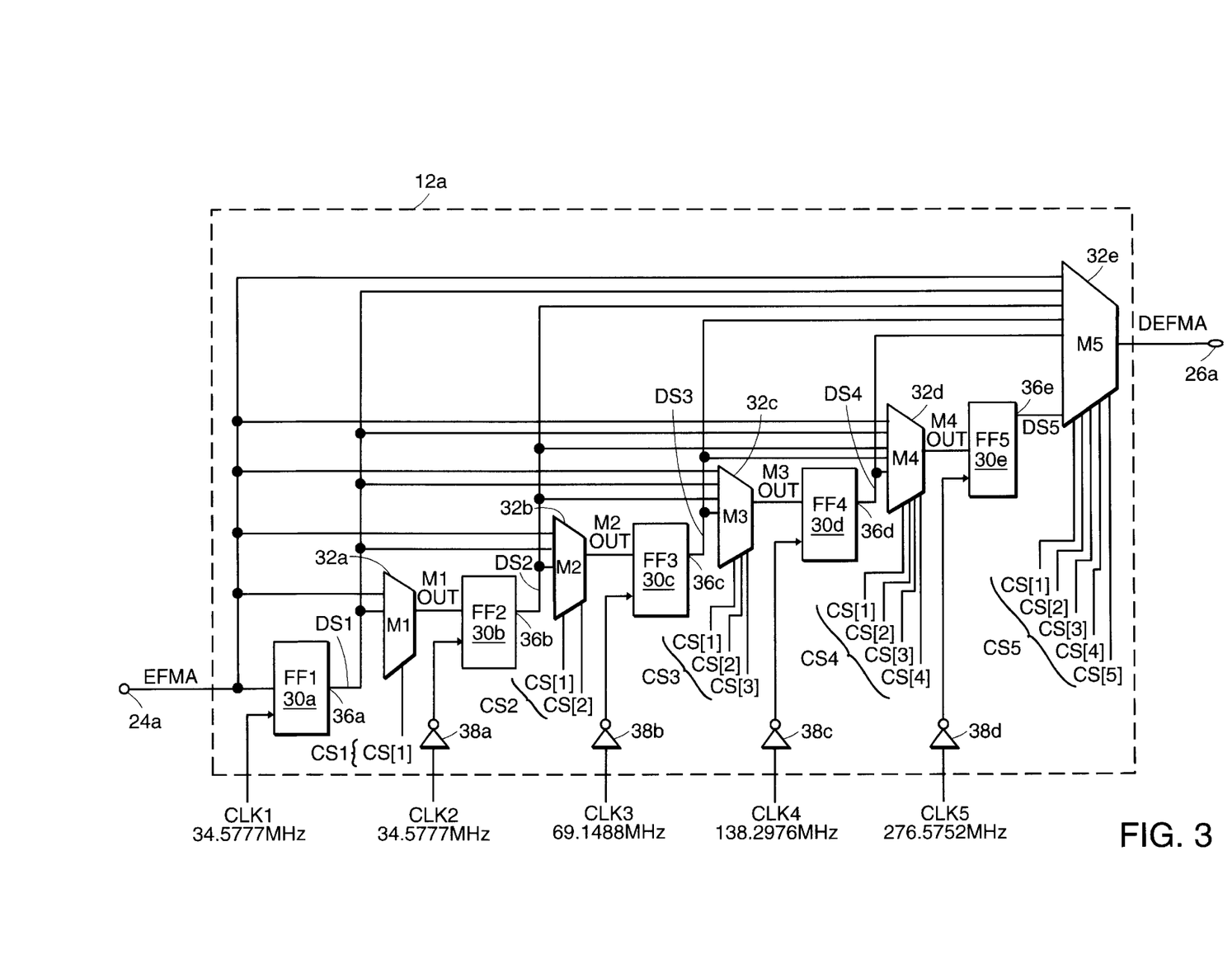
FIG. 3 is a block diagram of one of the delay units shown in FIG. 1.

FIG. 3 illustrates a delay block 12*a* for dynamically delaying by variable times the pulses in an EFM signal received at the delay block input 24*a*. The delay block 12*a* includes five D flip-flops 30(*a–e*) which are used as delay modules to provide delay to the signals received at the delay block input 24*a*. Each flip-flop 30(*a–e*) is followed by a selector or multiplexer 32(a–e, respectively) which receives the EFM signal and the delayed outputs of the prior flip-flops 30, and provides a delayed output signal to the subsequent flip-flop 30. For example, the third multiplexer 32*c* receives the EFM signal and the delayed output signals from the first, second and third flip-flops 30*a*, 30*b* and 30*c*, respectively. The third multiplexer 32*c* provides a delayed output signal to the fourth flip-flop 30*d*. The output of the fifth multiplexer 32*e* is the desired selectively delayed intermediate signal DEFMA to DEFME and is provided at the delay block output 26*a*.

Operation of each delay block 12 can be understood by sequential description of its circuit components. Referring to delay block 12*a*, the first flip-flop 30*a* receives the intermediate signal EFMA and a 34 MHz clock signal CLK1. Clock signal CLK1 is synchronous with the intermediate signal EFMA received at the delay block input 24*a*. The value of the intermediate signal EFMA immediately before each positive voltage transition of the clock signal CLK1 is provided as a first delayed signal DS1 at the output 36*a* of the first flip-flop 30*a*. The first multiplexer 32*a* receives the intermediate signal EFMA, the first delayed signal DS1, and a control signal CS1. A single bit control signal CS1 determines which of the two signals EFMA and DS1 received at the first multiplexer 32*a* to pass to the second flip-flop 30*b*. A 34 MHz clock signal CLK2, shifted in phase by 180° with respect to the first clock signal CLK1, is provided to the second flip-flop 30*b*. In this embodiment, the second clock signal CLK2 is generated from the first clock signal CLK1 by a logical inverter 38*a*. The signal M1OUT selected by the first multiplexer 32*a* is provided to the second flip-flop 30*b*. The value of the signal M1OUT immediately before the positive voltage transition of the second clock signal CLK2 is provided at the second flip-flop output 36*b*. The second multiplexer 32*b* receives the intermediate signal EFMA, the first delayed signal DS1, the second delayed signal DS2 and a two bit control signal CS2. The values of the control signal CS2 determines which of the three input signals EFMA, DS1 and DS2 is selected for input to the third flip-flop 30*c*.

The remainder of the delay unit 12*a* functions in a similar manner. The input signals to the third, fourth and fifth flip-flops 30*c*, 30*d* and 30*e* include the delayed signal from the previous multiplexer 32*b*, 32*c* and 32*d*, respectively, and a clock signal CLK3, CLK4 and CLK5, respectively, which is twice the frequency of the clock signal used by the previous flip-flop 30*b*, 30*c* and 30*d*, respectively. The input signals to the third, fourth and fifth multiplexers 32*c*, 32*d* and 32*e* include the intermediate signal EFMA and the delayed signals from all of the prior flip-flops 30. The input signal selected by the third, fourth and fifth multiplexers 32*c*, 32*d* and 32*e* is determined by control signal CS3, CS4 and CS5, respectively. The number of bits in each control signal CS is equal to the number of input signals for the corresponding multiplexer 32(*a–e*).

Figure 4A:
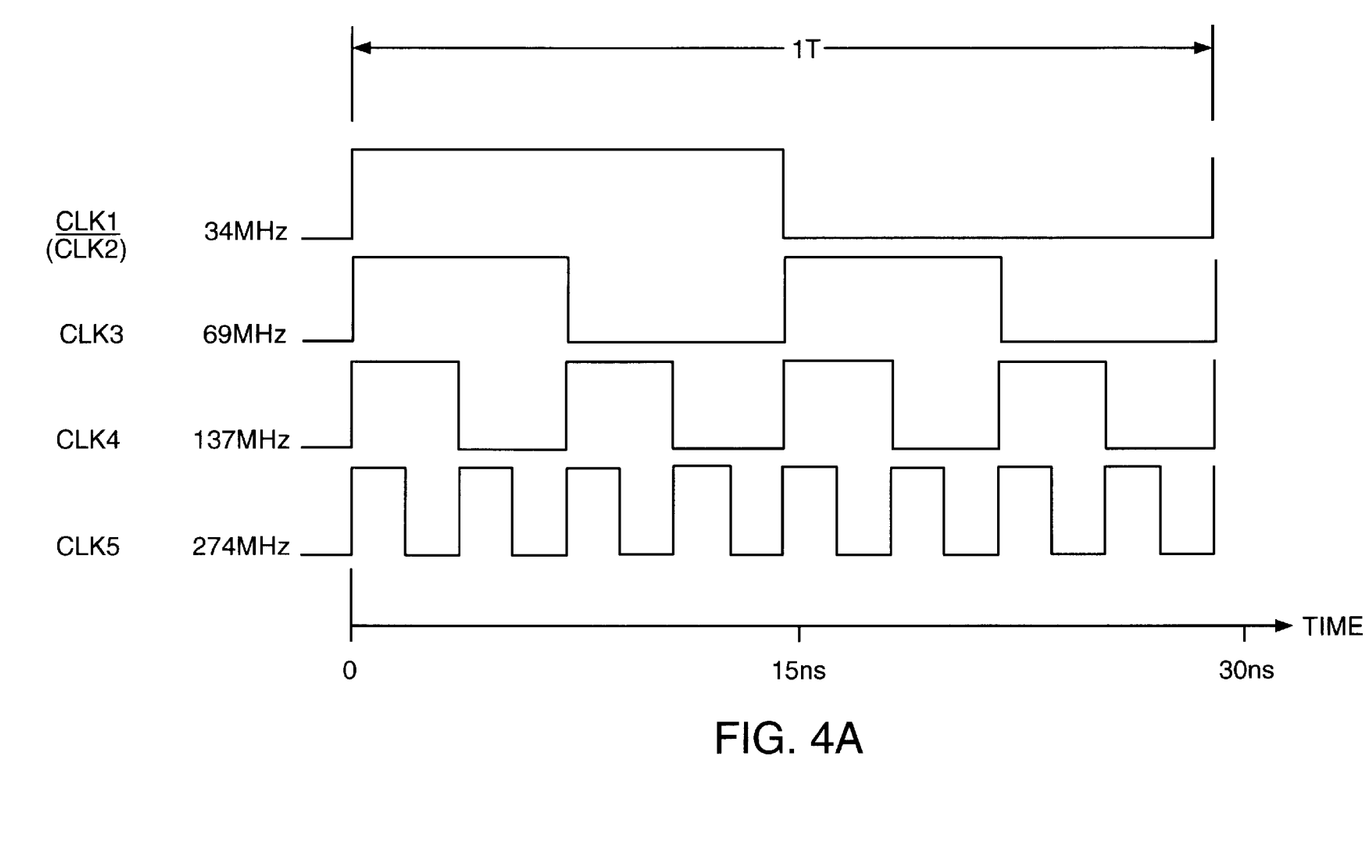
FIGS. 4A and 4B are timing diagrams depicting the clock signals and waveforms of the delay unit of FIG. 3.

Referring to FIG. 4A, each flip-flop 30(*a–e*) delays its input signal according to the period of its respective clock signal CLK1 to CLK5. For example, the first flip-flop 30*a* delays its input signal by T where T is approximately 28.9 ns. Because each flip-flop 30(*a–e*) is triggered on the first positive transition of its received clock signal CLK, the second flip-flop 30*b* will trigger at a time T/2 corresponding to the positive transition of logically inverted CLK1 or, equivalently, 180° phase shifted CLK1. Similarly, the delays generated by the third, fourth and fifth flip-flops 30*c*, 30*d* and 30*e*, respectively, are T/4, T/8 and T/16, respectively.

The total delay imposed on the EFM signal by the delay block 12*a* (FIG. 3) is approximately equivalent to the sum of the individual delays generated along the signal path selected through the delay block 12*a* as determined by the five multiplexers 32(*a–e*). Thus, by providing the proper control signals CS1 to CS5 to the five multiplexers 32(*a–e*), the EFM signal can be selectively delayed by a time value in a range from 0 to 31 T/16 with a resolution of T/16. For example and with reference back to FIG. 2, to delay an EFM signal pulse by approximately 38 ns (i.e., 21T/16) the delays generated by the first, third and fifth flip-flops 30*a*, 30*c* and 30*e*, respectively, are selected. Thus, the second multiplexer 32*b* selects the first delayed signal DS1 as the input signal for the third flip-flop 30*c*, the fourth multiplexer 32*d* selects the third delayed signal DS3 as the input to the fifth flip-flop 30*e*, and the fifth multiplexer 32*e* selects the fifth delayed signal DS5 as the signal presented at the delay block output terminal 26.

Figure 4B:
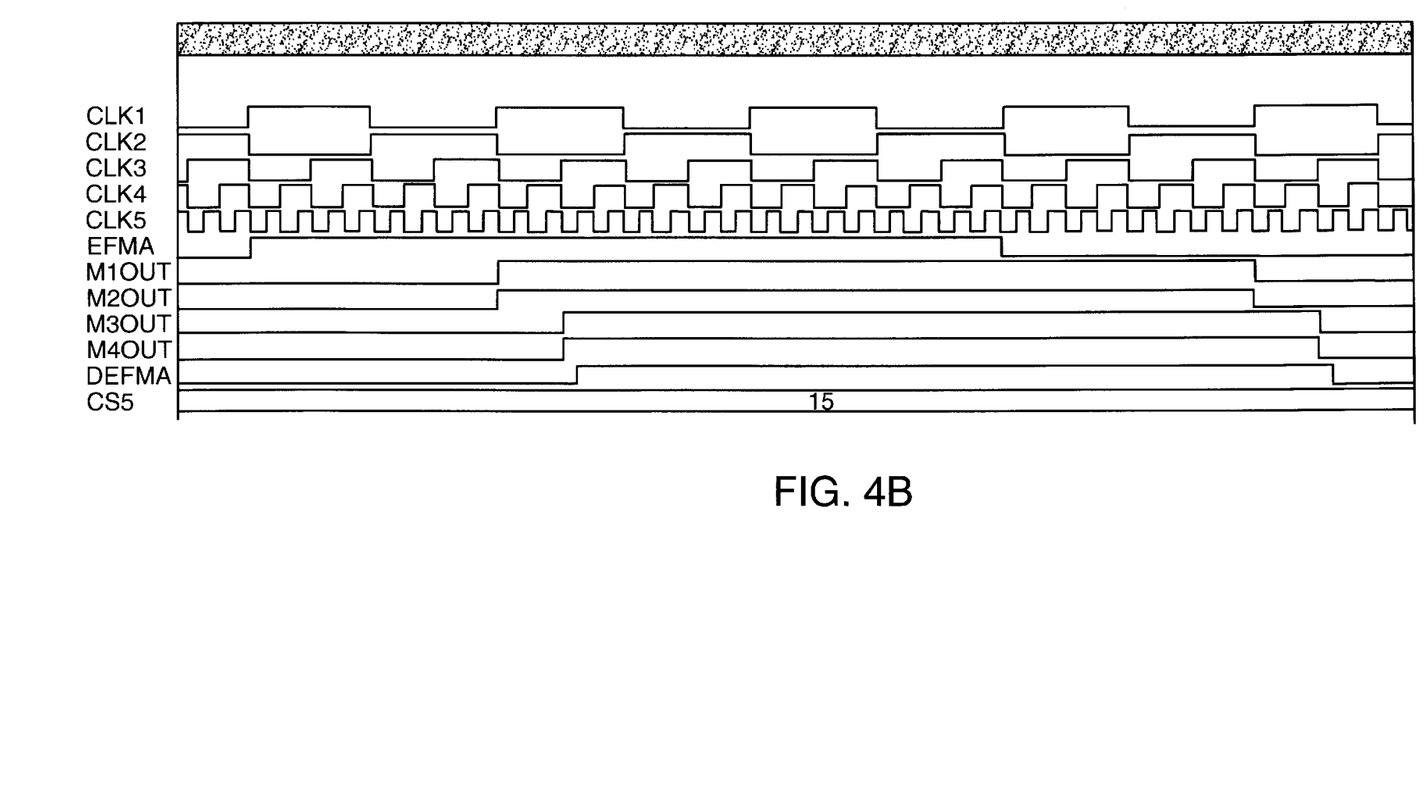

Referring to FIG. 4B, a set of signal waveforms corresponding to the delay unit of FIG. 3 is shown for fixed control signals CS1 to CS5. In this example CS5 has a hexadecimal value of 15. The five bits of CS5 are determined by the binary equivalent value for CS5, namely 10101. Control signals CS1 to CS4 correspond to the most significant bit, two most significant bits, three most significant bits and four most significant bits, respectively, of CS5. Clock signals CLK1 to CLK5 are synchronous with the intermediate signal EFMA received at the delay block input 24*a*. M1OUT to M4OUT are the output signal waveforms of multiplexers M1 to M4, respectively, and DEFMA is the delayed intermediate signal waveform provided at the output 26 of the delay block 12*a*.

Figure 5:
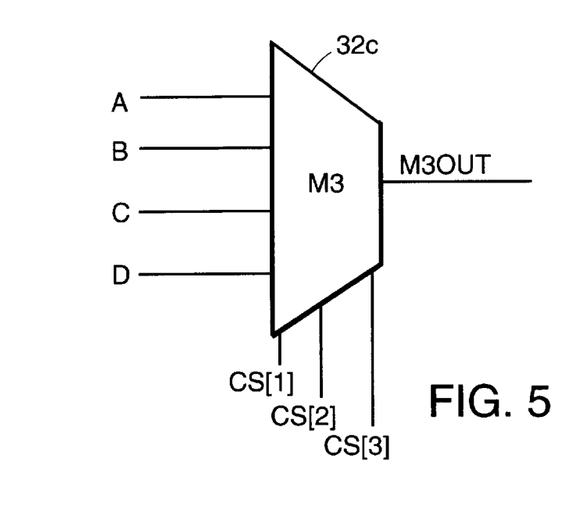
FIG. 5 is a block diagram of a priority multiplexer shown in FIG. 3.

Referring to FIG. 5, multiplexer operation can be explained by examination of an individual multiplexer 32*c* representative of any of the multiplexers 32(*a–e*). The third multiplexer 32*c* provides as an output signal M3OUT one of its four input signals A, B, C and D according to the three bits CS[1], CS[2] and CS[3] of its control signal CS3. The multiplexer output signal M3OUT is typically delayed with respect to the selected input signal A, B, C or D. The delay can be different for each signal A, B, C and D because typically the corresponding internal paths through the multiplexer 32*c* are unequal.

Figure 6:
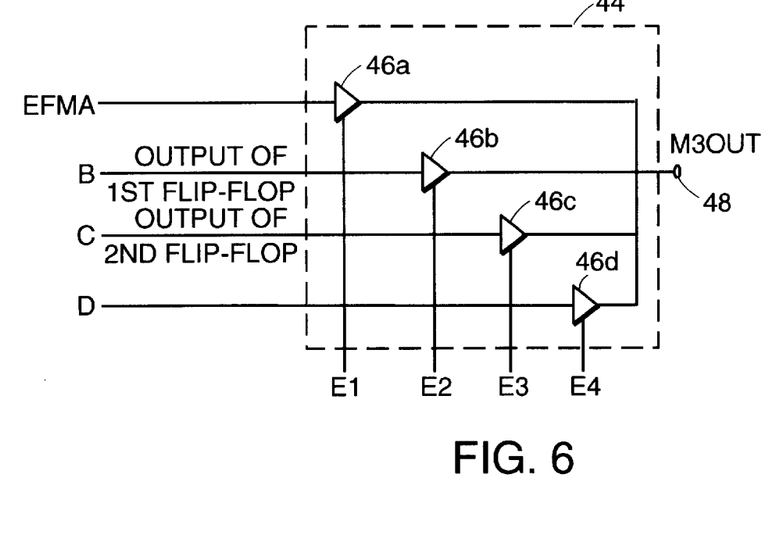
FIG. 6 is a schematic diagram of a tri-state buffer priority multiplexer.
Figure 7:
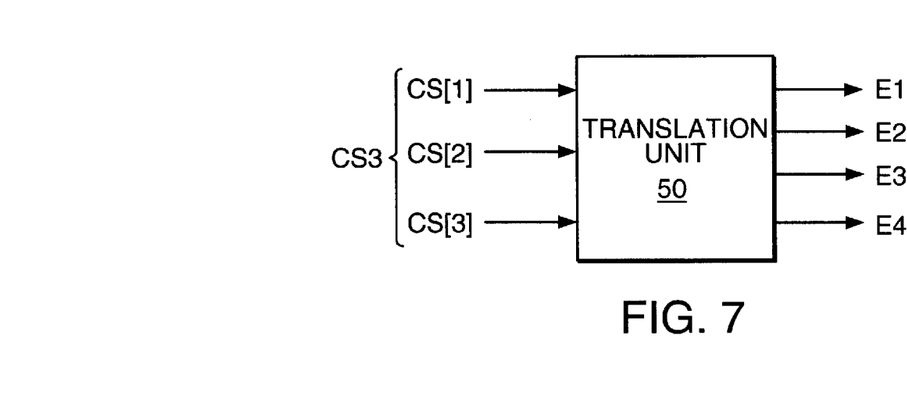
FIG. 7 is a block diagram of a translation unit for generation of enable signals used to control the priority multiplexer of FIG. 6.

FIG. 6 shows a multiplexer 44 based on tri-state buffers 46(*a–d*) which can be used to achieve the same functionality of the multiplexer 32*c* of FIG. 5 while providing a substantially uniform multiplexer path delay for input signals A, B, C and D. The multiplexer 44 includes a tri-state buffer 46(*a–d*) for each input signal A, B C and D, respectively. Each buffer 46(*a–d*) is enabled with a single enable signal E1, E2, E3 and E4, respectively. The outputs of the buffers 46(*a–d*) are coupled to the multiplexer output 48. A translation unit 50 as shown in FIG. 7 is used to convert the three-bit multiplexer control signal CS3 used to control the third multiplexer 32*c* into four enable signals E1 to E4 used to control the tri-state multiplexer 44.

Figure 8:
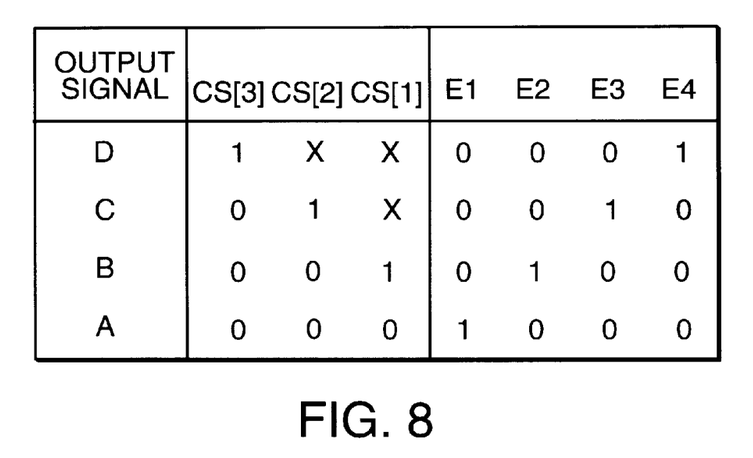
FIG. 8 is a truth table illustrating the relationship between the select signals used to control the priority multiplexer of FIG. 5 and the enable signals used to control the priority multiplexer of FIG. 6.

In order to avoid an indeterminate state at the multiplexer output 48, only one enable signal E1 to E4 is asserted at one time. Thus, there must be a priority (i.e., a relative significance) assigned to the control bits s1 to s3. FIG. 8 is a logic table indicating the relationship between the input signals A, B, C and D, control bits CS[1] to CS[3], and enable signals E1 to E4. A "1" indicates an asserted bit or signal and a "0" is used to indicate an unasserted bit or signal. An "X" is used to indicate that the state of the bit or signal is not relevant to determination of the multiplexer output signal M3OUT. Control bit CS[3] has the highest priority. Thus, when control bit CS[3] is asserted, the output signal M3OUT is signal D regardless of the values of bits CS[1] and CS[2]. Control bit CS[2] has intermediate priority and therefore determines the output M3OUT only when control bit CS[3] is unasserted. Control bit CS[1] has the lowest priority. Thus, even if control bit CS[1] is asserted, it cannot determine the output M3OUT unless both CS[2] and CS[3] are unasserted. Enable signals E1 to E4 are generated such that only one can be asserted at one time, therefore, there is no similar priority requirement.

Figure 9:
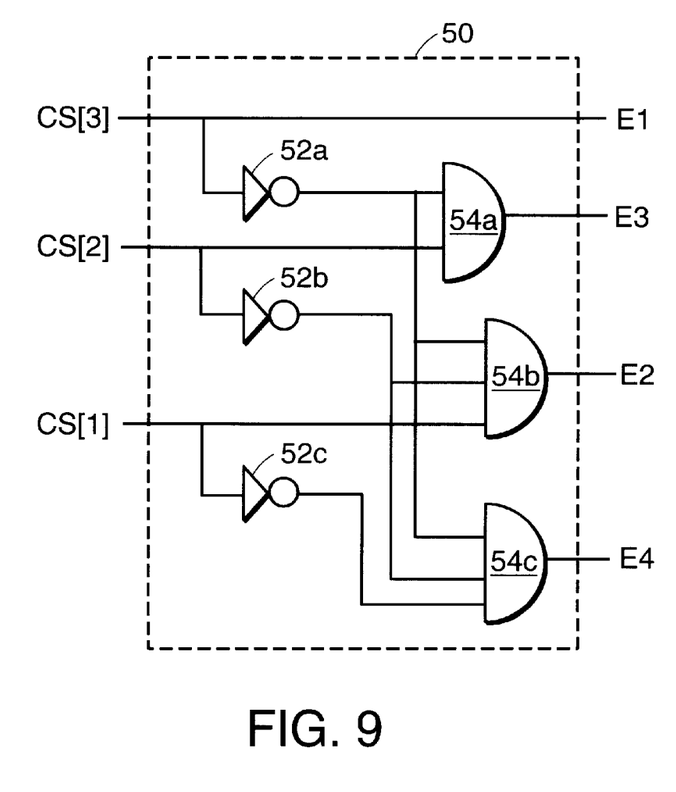
FIG. 9 is a schematic diagram of a translation unit as shown in FIG. 7.

FIG. 9 illustrates a translation unit 50 using inverters 52(*a–c*) and AND gates 54(*a–c*) that can be used to generate the enable signals E1 to E4 from the control bits CS[1] to CS[3]. Control bit CS[3] is provided as enable signal E1 and as an input to an inverter 52*a*. AND gate 54*a* receives control bit CS[2] and inverted control bit CS[3] as inputs and generates enable signal E3. AND gate 54*b* receives inverted control bits CS[2] and CS[3] from inverters 52*b* and 52*a*, respectively, and generates enable signal E2. AND gate 54*c* receives inverted control bits CS[1], CS[2] and CS[3] from inverters 52*c*, 52*b* and 52*a*, respectively, and generates enable signal E4.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A delay circuit for generating a selectable delay comprising:
   a first delay module having a first delay module signal input adapted to receive an electrical signal to be delayed, a first delay module clock input and a first delay module signal output;
   a first selector having a first selector first input in electrical communication with the first delay module signal input, a first selector second input in electrical communication with the first delay module signal output, a first selector output and a first selector control input;
   a second delay module having a second delay module signal input in electrical communication with the first selector output, a second delay module clock input and a second delay module signal output; and
   a second selector having a second selector first input in electrical communication with the first delay module signal input, a second selector second input in electrical communication with the first delay module signal output, a second selector third input in electrical communication with the second delay module signal output, a second selector output and a second selector control input,
   wherein a selected pulse delay is generated in response to a first and second control signal received at the first and second selector control inputs, respectively.

2. The circuit of claim 1 wherein the second selector control input comprises a plurality of control lines and wherein the second control signal comprises a plurality of control bits, each of the plurality of control lines adapted to receive a respective bit of the plurality of control bits.

3. The circuit of claim 2 wherein each of the plurality of control bits is prioritized relative to each of the other of the plurality of control bits.

4. The circuit of claim 2 wherein the second selector is a priority multiplexer.

5. The circuit of claim 1 wherein the each of the first and second delay modules comprise a flip-flop.

6. The circuit of claim 1 further comprising an inverter in electrical communication with the second delay module clock input.

7. The circuit of claim 1 further comprising a phase-shifter having an input in electrical communication with the first delay module clock input and an output in electrical communication with the second delay module clock input,
   wherein the phase-shifter generates a clock signal at the output of the phase-shifter output substantially opposite in phase to a clock signal received at the input of the phase shifter.

8. The circuit of claim 1 wherein each of the first and second signal selectors is a multiplexer.

9. The circuit of claim 2 wherein the first selector comprises:
   a first tri-state buffer in electrical communication with the first delay module signal input and having a first buffer enable input and a first buffer output;
   a second tri-state buffer in electrical communication with the first delay module signal output and having a second buffer enable input and a second buffer output in electrical communication with the first buffer output.

10. The circuit of claim 9 wherein the second selector comprises:
    a third tri-state buffer in electrical communication with the first delay module signal input and having a third buffer enable input and a third buffer output;
    a fourth tri-state buffer in electrical communication with the first delay module signal output and having a fourth buffer enable input and a fourth buffer output in electrical communication with the third buffer output; and
    a fifth tri-state buffer in electrical communication with the second delay module signal output and having a fifth buffer enable input and a fifth buffer output in electrical communication with the third buffer output.

11. A method of generating a selectively delayed signal, comprising:

a) receiving a signal to be delayed;

b) generating a first delayed signal in response to a first clock delay signal having a first frequency;

c) selecting one of the signal to be delayed and the first delayed signal as a first output signal;

d) generating a second delayed signal in response to a second clock delay signal having a second frequency and the selected one of the signal to be delayed and the first delayed signal; and e) selecting one of the signal to be delayed, the first delayed signal and the second delayed signal as the selectively delayed signal.

12. The method of claim 11 wherein the second clock delay signal is complementary to the first clock delay signal.

13. The method of claim 11 wherein the first frequency is substantially equal to the second frequency.

14. The method of claim 11 further comprising generating a third delayed signal in response to a third clock delay signal having a third frequency and the selected one of the signal to be delayed, the first delayed signal and the second delayed signal and wherein e) comprises selecting one of the signals to be delayed, the first delayed signal, the second delayed signal and the third delayed signal as the selectively delayed signal.

15. The method of claim 12 wherein the third frequency is different from the first and second frequencies.

* * * * *